(12) United States Patent
Srinivasan et al.

(10) Patent No.: US 10,680,056 B1
(45) Date of Patent: Jun. 9, 2020

(54) IC WITH ION MILLED THIN-FILM RESISTORS

(71) Applicant: Texas Instruments Incorporated, Dallas, TX (US)

(72) Inventors: Bhaskar Srinivasan, Allen, TX (US); Brian Goodlin, Plano, TX (US); Dhishan Kande, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/232,653

(22) Filed: Dec. 26, 2018

(51) Int. Cl.
| | | |
|---|---|---|
| H01L 21/00 | (2006.01) | |
| H01L 49/02 | (2006.01) | |
| H01L 21/70 | (2006.01) | |
| H01L 21/66 | (2006.01) | |
| H01C 17/24 | (2006.01) | |
| H01L 21/822 | (2006.01) | |
| H01C 7/00 | (2006.01) | |

(52) U.S. Cl.
CPC ............. *H01L 28/20* (2013.01); *H01C 7/006* (2013.01); *H01C 17/2404* (2013.01); *H01L 21/707* (2013.01); *H01L 21/822* (2013.01); *H01L 22/14* (2013.01)

(58) Field of Classification Search
CPC ..... H01L 21/707; H01L 21/70; H01L 21/822; H01L 21/746; H01L 21/82; H01L 21/76297; H01L 21/8221; H01L 21/8226; H01L 21/77; H01L 21/782; H01L 21/00; H01L 21/7624
USPC .................................. 438/14, 200, 210, 329
See application file for complete search history.

(56) References Cited

U.S. PATENT DOCUMENTS

| | | | | |
|---|---|---|---|---|
| 2008/0202209 A1* | 8/2008 | Lambkin | ................... | G01J 1/04 73/31.05 |
| 2011/0121366 A1* | 5/2011 | Or-Bach | ............. | H01L 21/6835 257/204 |

FOREIGN PATENT DOCUMENTS

EP          0070809 A2        1/1983

* cited by examiner

*Primary Examiner* — Chuong A Luu
(74) *Attorney, Agent, or Firm* — Andrew R. Ralston; Charles A. Brill; Frank D. Cimino

(57) ABSTRACT

A method of fabricating an integrated circuit (IC) includes providing a substrate having a semiconductor surface layer comprising an unpatterned resistive layer. Measurements are obtained of a characteristic of the unpatterned resistive layer at each of a plurality of locations over the substrate. The unpatterned resistive layer is modified, such as by targeted removal of layer material, in response to the measurements such that the measured characteristic is more uniform across the substrate. A resistor on the IC is defined from the unpatterned resistive layer after the modifying.

20 Claims, 6 Drawing Sheets

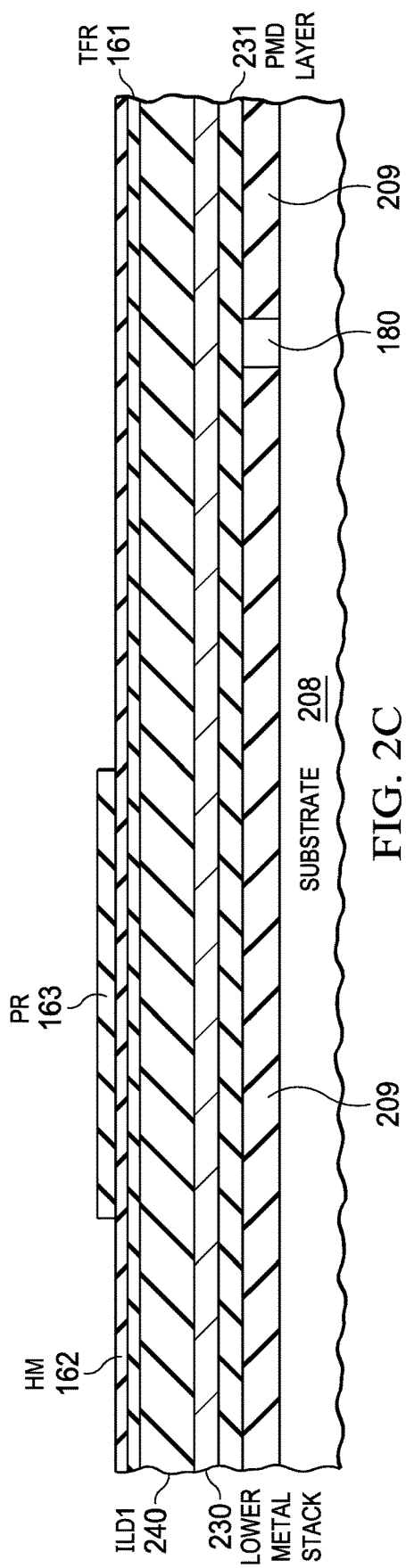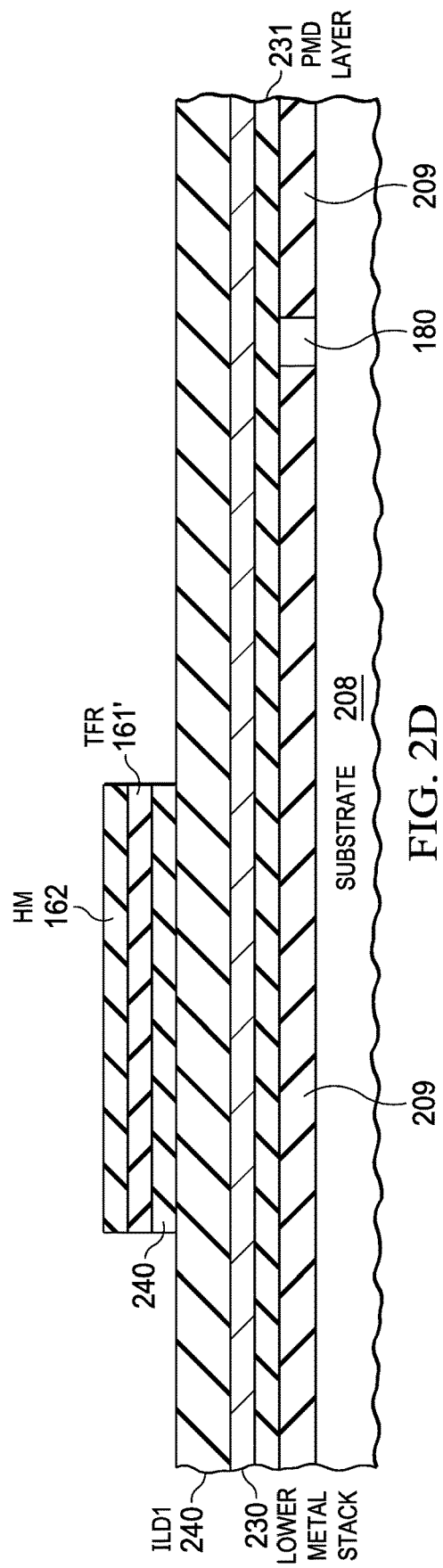

IC WITH ION MILLED THIN-FILM RESISTORS

FIELD

This Disclosure relates to the field of semiconductor devices, and more particularly, but not exclusively, to semiconductor integrated circuit (IC) devices having thin film resistors (TFRs), and the trimming of such TFRs.

BACKGROUND

Some IC devices include TFRs for their precision resistor needs. A TFR generally may have a thickness on the order of 0.1 µm or less, while a thick film resistor may be at least a thousand times thicker. Silicon Chromium (SiCr) and nickel chromium (NiCr) have been used for years as TFRs due to their relatively high electrical resistance in thin film form, relatively low temperature coefficient of resistance (TCR), and the ability to reliably carry relatively high current density. TFRs may be laser trimmed, particularly for precision ICs, such as for setting an operational-amplifier's input offset voltage or a voltage reference circuit's output voltage.

Laser trimming is accomplished by ablating away part of the TFR structure on the final IC die when in wafer form using a laser beam, such as using a neodymium-doped yttrium aluminum garnet (YAG) laser. The laser trimming is customized for each die, with the trimming generally controlled based on measured electrical data from the electrical testing of each IC die. As the TFR's effective cross-sectional area is reduced, its resistance increases. The laser trimming is commonly performed in conjunction with wafer probing and the laser beam may be transmitted through a passivation layer and through one or more Inter Level Dielectric (ILD) layers thereunder to reach the TFR(s).

SUMMARY

This Summary is provided to introduce a brief selection of disclosed concepts in a simplified form that are further described below in the Detailed Description including the drawings provided. This Summary is not intended to limit the claimed subject matter's scope.

This application discloses various methods and devices that may be beneficially applied to manufacturing integrated circuits (ICs) including TFRs and matching circuits using TFRs, e.g. may provide better cross-wafer uniformity of a resistive layer (e.g., a TFR layer), and more uniform resistance of TFRs formed from the resistive layer in ICs formed on the wafer. While such embodiments may be expected to provide improvements of such ICs, such as reduced die size and/or reduced processing cost, no particular result is a requirement of the described invention(s) unless explicitly recited in a particular claim.

Disclosed aspects in one example include a method of fabricating an IC that comprises using an ion mill, e.g. a Gas Cluster Ion Beam (GCIB), to trim an unpatterned TFR layer that is over a semiconductor surface layer of a substrate (e.g., a wafer) having a plurality of ICs at an intermediate stage of fabrication. The ICs may be referred to herein a "die", even if the ICs are not yet singulated. The ion milling may improve the sheet resistance (Rs) uniformity of the TFR layer across the substrate and across each die, and may also reduce the surface roughness of the TFR layer. In one example application, TFRs on the IC die formed by patterning the TFR layer are part of a matching circuit that includes matched TFRs (e.g., that are electrically connected in parallel), for which proper IC operation relies on high precision TFR resistance matching.

Disclosed aspects in another example include a method of fabricating an IC, the method including forming an unpatterned resistive layer over a semiconductor substrate. Measurements are obtained of a characteristic of the unpatterned resistive layer at each of a plurality of locations over the substrate. The unpatterned resistive layer is modified in response to the measurements such that the measured characteristic is more uniform across the substrate. At least one resistor is defined on the IC from the unpatterned resistive layer after the modifying.

Disclosed aspects further include an IC comprising a substrate having a semiconductor surface layer including circuitry comprising matching circuitry configured for realizing at least one circuit function, with an ILD layer on a metal layer above the semiconductor surface layer. There are a plurality of TFRs on the ILD layer including a first TFR and at least a second TFR, wherein the matching circuitry comprises the first. A surface of the plurality of TFRs across the IC have an average surface roughness of less than 3 nm, and/or may have a difference of thickness less than about 1.5%.

BRIEF DESCRIPTION OF THE DRAWINGS

Reference will now be made to the accompanying drawings, which are not necessarily drawn to scale, wherein:

FIGS. 2A-2F are cross-sectional diagrams showing processing progression for an example method of forming an IC having TFRs comprising using GCIB processing to ion mill trim an unpatterned TFR layer on an ILD layer on a metal layer above a substrate, according to an example aspect.

DETAILED DESCRIPTION

Figure 1:
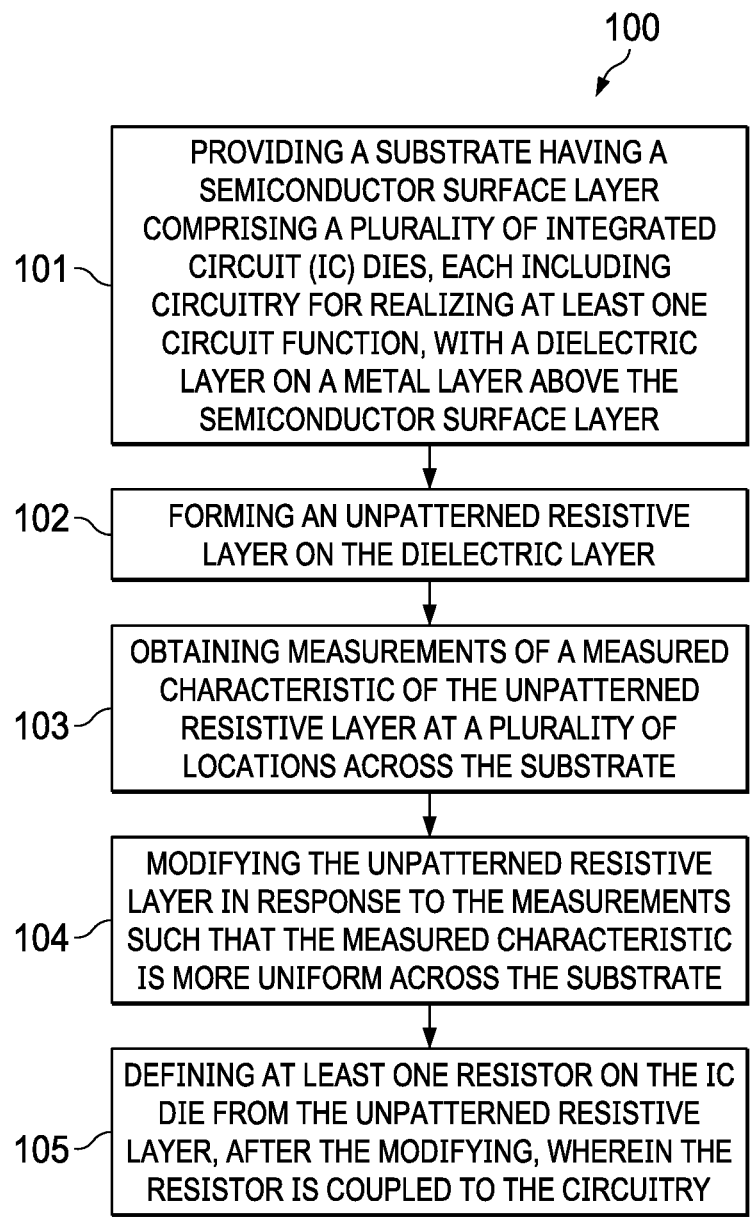
FIG. 1 is a flow chart that shows steps in an example method of fabricating an IC having TFRs comprising GCIB processing to ion mill trim an unpatterned TFR layer over a semiconductor surface layer of a substrate (e.g., a wafer), according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize conventional custom laser trimming of patterned TFRs on each completed IC die on each wafer performed in conjunction with wafer probing is time intensive leading to high probe cost. Moreover, conventional laser trimming of the TFRs typically includes transmitting the laser light through a passivation layer and ILD layer(s) above the TFRs. The laser light can damage these dielectric layers in the laser beam path leading to IC leakage or other reliability issues. Instead of laser trimming the patterned TFRs on each IC die at wafer probe, disclosed methods instead perform the trimming before patterning the TFRs by utilizing GCIB processing to ion mill trim an unpatterned TFR layer based on a measured characteristic of the TFR layer, such as a TFR layer thickness or TFR layer sheet resistance (Rs) for the unpatterned TFR layer. Moreover, in some cases only one substrate in a group of substrates being manufactured together (a "lot") need be fully characterized, with a single fully characterized (e.g. mapped) substrate providing sufficient information to trim the unpatterned TFR layer on other substrates in the lot based on a partial characterization of those substrates.

FIG. 1 is a flow chart that shows steps in an example method 100 of fabricating an IC having TFRs, the method comprising GCIB processing to ion mill trim an unpatterned TFR layer. Step 101 comprises providing a substrate (e.g., a wafer) having a semiconductor surface layer comprising a plurality of IC die each including an instance of circuitry configured for realizing at least one circuit function. The IC die may include a dielectric layer such as an ILD layer on a metal layer above the semiconductor surface layer. The IC die may comprise an analog circuit or a mixed signal circuit (e.g., an analog-to-digital converter (ADC) or digital-to-analog converter (DAC)) that includes matching circuitry. Such circuitry may include a matching circuit having matching TFRs that are electrically in parallel to one another.

The substrate may include a silicon wafer having a size that is at least 200 mm in diameter, such as a 300 mm diameter substrate. The TFRs on the final IC can include a first TFR and at least a second TFR, wherein the circuitry can include matching circuitry that includes the first and the second TFR. The first and second TFRs in the matching circuitry may be electrically connected in parallel to one another. (See IC 350 in FIG. 3B described below). In some IC designs TFRs may be used in other circuitry configurations, such as when connected in series to increase a total resistance that may need to be accurate for proper IC operation. In one such example there may be only 1,000 ohm/sq (a relatively thin TFR layer) and 100 ohm/sq (a relatively thick TFR) resistors available in the process. The material for the TFRs can be highly doped polysilicon to provide what is termed a zero temperature coefficient resistor (ZTCR), or a metal or metal compound, such as a chromium compound, for example silicon chromium (SiCr) or nickel chromium (NiCr).

Step 102 comprises forming an unpatterned resistive layer (e.g., a TFR layer) on the dielectric layer, e.g. by sputtering. A thickness of the resistive layer as deposited may be in a range between about 2 nm and about 40 nm, sometimes in a range between about 4 nm and about 30 nm. The resistive layer as deposited may have a 20 Å (2 nm) surface roughness for a 35 nm to 40 nm thick resistive layer, and 10 Å (1 nm) average surface roughness for a resistive layer that is 3.5 nm to 5.0 nm thick.

Step 103 comprises obtaining measurements of a characteristic of the unpatterned resistive layer at each of a plurality of locations over the substrate, such as to generate a map of the resistive layer measurements across the substrate. Such measurements determine a characteristic of the TFR at each location. In one example, the characterization may include a thickness measurement using an optical-based method or an Rs measurement using a 4-point probe.

Optionally, the method can further comprise interpolating (e.g., linear interpolating) to provide a higher areal resolution as compared to the measurements of the TFR layer. The interpolation generates data in locations that are between the locations directly measured. Interpolating may be suitable in general unless one has available a high density of characteristic measurements, such as at least 49 points on a 300 mm wafer. In some cases a map including at least 121 points may be suitable. In the case of Rs measurements, the Rs vs. thickness relation is generally linear, although in some cases this relation may be non-linear depending on the resistive layer composition, and for the very low thickness regime (e.g., less than 3 nm thick resistive layer).

Step 104 comprises modifying the unpatterned resistive layer in response to the measurements such that the measured characteristic is more uniform across the substrate. GCIB processing may be used including scanning using a two-dimensional (2D) raster scan for scanning a cluster ion beam to ion mill the unpatterned restive layer. A scan speed may be modulated based on the resistive layer map to result in a desired material removal at each location across the area of the substrate.

GCIB is a technology for nanoscale modification of surfaces that is recognized herein to be able to smooth a wide variety of surface material types to within about 1 Å to 5 Å of average surface roughness without adding significant subsurface damage. GCIB can also optionally be used to chemically alter the surface through infusion or deposition. The GCIB beam is used to treat a surface of the unpatterned resistive layer, where typically the substrate is mechanically scanned by the cluster ion beam to allow uniform irradiation of the area of the resistive layer surface.

In one example the GCIB beam current is about 0.1 mA, the beam energy is in a range between about 30 keV and about 60 keV, and the total beam power is about 5 W. Under such conditions example etch rates may be in a range between about 50 nm-cm$^2$/sec and about 120 nm-cm$^2$/sec. Depending on the removal thickness, for example about 30 to 50 Å, and the area of trim per wafer being 350 to 700 cm$^2$, the etch times vary 9 to 29 seconds for an etch rate of 120 nm-cm$^2$/sec, and the etch times vary 21 to 71 seconds for an etch rate of 50 nm-cm$^2$/s.

GCIB processing times are generally based on the etch rate, the wafer area and the resistive layer material removal rate. For example, the processing time of a 200 mm wafer will typically be less than the processing time of a 300 mm wafer, and a TFR film with a lower initial nonuniformity will typically require less processing time than a TFR film with a higher initial nonuniformity. It is expected that a single wafer may be processed in 3 min to 12 min, which translates to a throughput of 5 to 20 wafers per hour (WPH), well within acceptable process throughput in a semiconductor manufacturing setting.

The GCIB scanning results in at least one of etching (e.g. material removal by ablation) of the resistive layer material, and surface modification of the resistive layer material such as at least partial oxidation or nitridation of the unpatterned resistive layer. The etching and/or surface modification may reduce surface roughness (resistive layer smoothing) and variation in the Rs across the substrate. As noted above the substrate can comprise a wafer that is at least 200 mm in diameter. A six standard deviation (6σ) Rs uniformity of thickness and/or Rs of the TFR layer after the GCIB processing across a full area of such a substrate (e.g., wafer), excluding a typical edge exclusion of 3 mm, may be less than about 3%, and in some cases may be no greater than about 1.5%.

The scanning may include a single pass raster scan in which the surface of the substrate is scanned by the ion beam by multiple parallel beam paths, with adjacent parallel beam paths progressing in opposite directions (e.g. left-right or up-down). The adjacent ion beam paths may overlap, such that a portion of the TFR layer between adjacent path centerlines receives ion flux from the ion beam as the beam spot progresses in both directions. Multiple process control parameters such as process gas flow, energy, ionizer setting, cluster size (e.g., 1k to 10k molecules per cluster with a size of about 30 Å), gas type ($NF_3CF_4$, $CHF_3$, $N_2$, $O_2$, or Ar), beam current, and beam energy, can be used to adjust etch rate over a wide range and maintain the beam profile/shape over a wide range of etch conditions. The TFR layer can be on a planar or a non-planar substrate surface. GCIB processing may be carried out at room temperature, and may result in little or no charging of the substrate (e.g., wafer). The obtainable 1σ TFR thickness variation may be less than 1 nm, even in localized regions with large initial unpatterned TFR layer thickness gradients.

Step 105 comprises defining at least one resistor (e.g., a TFR) on the plurality of IC die from the unpatterned resistive layer, wherein the resistor(s) is coupled to the circuitry on each of the IC die. The defining can comprise conventional photoresist or hardmask (e.g., oxide, nitride, or an oxynitride film), patterning then etching, or a liftoff process which is also generally possible.

Argon is a commonly used gas in GCIB processing because it is inexpensive and chemically inert so that it only results in etching of the TFR layer, is inexpensive. However, processes within the scope of the Disclosure are not limited to any particular gas. Argon readily forms ion clusters, and the Ar atoms in the cluster are bound together with Van der Waals forces. When overlapping scans are performed the GCIB surface treatment allows every point on the substrate (e.g., wafer) surface to be struck by many ion clusters, resulting in the smoothing of surface irregularities to produce an atomic level smoothness, such as an Atomic Force Microscopy (AFM)-derived average surface roughness of less than 3 nm, such as an average surface roughness less than 1.5 nm, including less than 1 nm.

A top surface of the TFRs can comprise a modified composition as compared to a region of the TFRs below the top surface (e.g. "bulk" region) when the GCIB processing uses a reactive gas. The TFR film density on the final IC can be 4 to 6 $g/cm^3$, such as 4.5 to 5.5 $g/cm^3$. The die size of the IC is not limited to any particular value. The resulting highly uniform unpatterned resistive layer may allow TFR trimming features such as trim blocks to be omitted, allowing for reduced device size. Some devices that use TFRs may have die dimensions such as 800 μm×1300 μm, or 800 μm×700 μm depending on the IC functionality and components. The a of the Rs for the TFRs over such a die area may be less than 0.5%. The ILD layer for disclosed ICs is generally exclusive of any laser burn regions, meaning laser burn areas are generally not present, particularly when no laser TFR trimming is used. Disclosed methods can also enable the IC to be exclusive of a conventional laser trim block that comprises the same material as for the plurality of resistors (e.g. TFRs).

The substrate that is measured to obtain the measured characteristic may be a member of a lot comprising a plurality of the substrates, e.g. silicon wafers. In such cases it may be assumed that the cross-wafer variation of measured characteristic, e.g. TFR thickness or Rs map, will be similar between the measured substrate and the remaining members of the lot of substrates. For the remaining substrates, an average value of the characteristic may be determined without necessarily determining a wafer-level map of the characteristic. The wafer-level map determined for the measured substrate may be applied to the remaining wafers in the lot for determining the GCIB process conditions, adjusting the trimming process as needed based on the difference between the average characteristic value for the measured substrate and the average characteristic value for each remaining substrate. This feature can thus utilize the distribution of the measured characteristic for the measured substrate, e.g. resistive layer thickness or its Rs, including relative magnitudes of the distribution, such as a linear radial distribution characteristic of a sputter deposition for forming the resistive layer, where the center of the substrate has the thinnest resistive layer, thus being the highest in Rs.

While various examples of this Disclosure describe the use of GCIB for the ion milling, it is noted that embodiments are not limited to GCIB. While GCIB may provide beneficial process characteristics, including a chemically benign interaction with the resistive layer, other targeted ablative processes may alternatively be used, such as focused ion beam (FIB) milling or other future-developed targeted milling techniques, particularly those which minimize potential changes to the stoichiometry of the resistive layer.

Figure 2A:
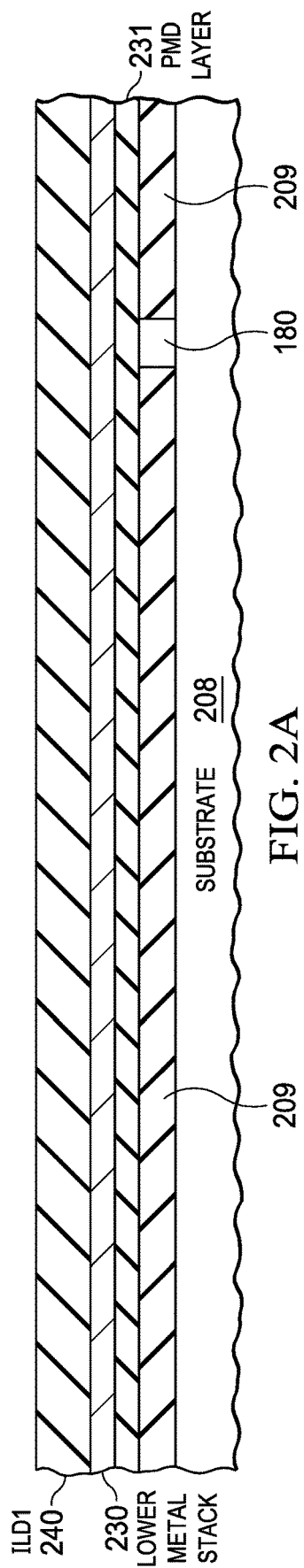

FIGS. 2A-2F are cross-sectional diagrams showing processing progression for an example method of forming an IC having TFRs comprising using GCIB processing to ion mill trim an unpatterned TFR layer, according to an example aspect. FIG. 2A shows an in-process IC comprising a substrate 208 having at least a semiconductor surface layer 209 (e.g., an epitaxial layer) with a pre-metal dielectric (PMD) layer 231 thereon that can comprise deposited silicon oxide, where the circuitry 180 which comprises a plurality of transistors formed in the semiconductor surface layer 209 shown as a block was earlier formed in the process. The substrate 208 and/or semiconductor surface layer 209 can comprise silicon, silicon-germanium, or other semiconductor material.

There is a lower metal stack 230 comprising at least one metal layer (e.g., metal 1) on the PMD layer 231, and an interlevel dielectric layer shown as ILD1 layer 240 is on the lower metal stack 230. The ILD1 layer 240 may comprise a deposited silicon oxide. The circuitry 180 comprises circuit elements (including transistors, and generally diodes, resistors, capacitors, etc.) formed in or over the semiconductor surface layer 209 configured together with the later defined TFRs for realizing at least one circuit function such as analog (e.g., an amplifier, power converter or power field effect transistor (FET)), radio frequency (RF), digital, mixed signal, or a memory function.

Figure 2B:
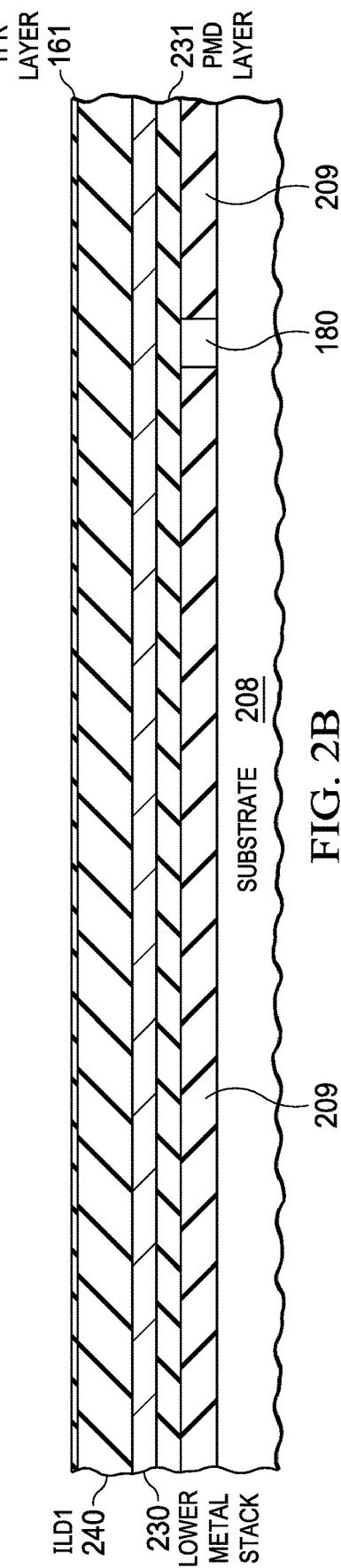
Figure 2E:
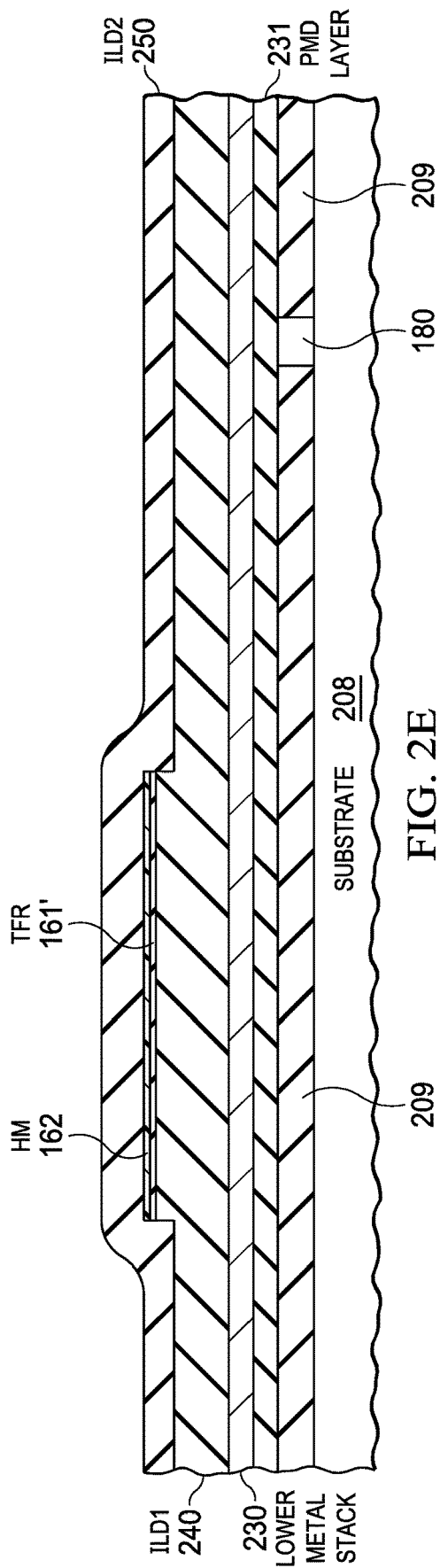

FIG. 2B shows the in-process IC after the deposition of the TFR layer 161 on the ILD1 layer 240. Disclosed mill trimming by GCM is performed on the TFR layer 161, thus being performed on an unpatterned TFR layer. FIG. 2C shows the in-process IC after the deposition of a hardmask (HM) layer 162 (e.g., silicon nitride) on the TFR layer 161. A photoresist (PR) layer 163 pattern is also shown on the HM layer 162. FIG. 2D shows the in-process IC after etching the HM layer 162 and the TFR layer 161 to define a plurality of TFR portions with TFR portion 161' shown after the stripping of the PR layer 163. This etch stops in or on the ILD1 layer 240. FIG. 2E shows the in-process IC after the deposition of a second ILD (ILD2) layer 250. The ILD 2 layer 250 over TFR portion 161' comprises deposited silicon oxide.

Figure 2F:
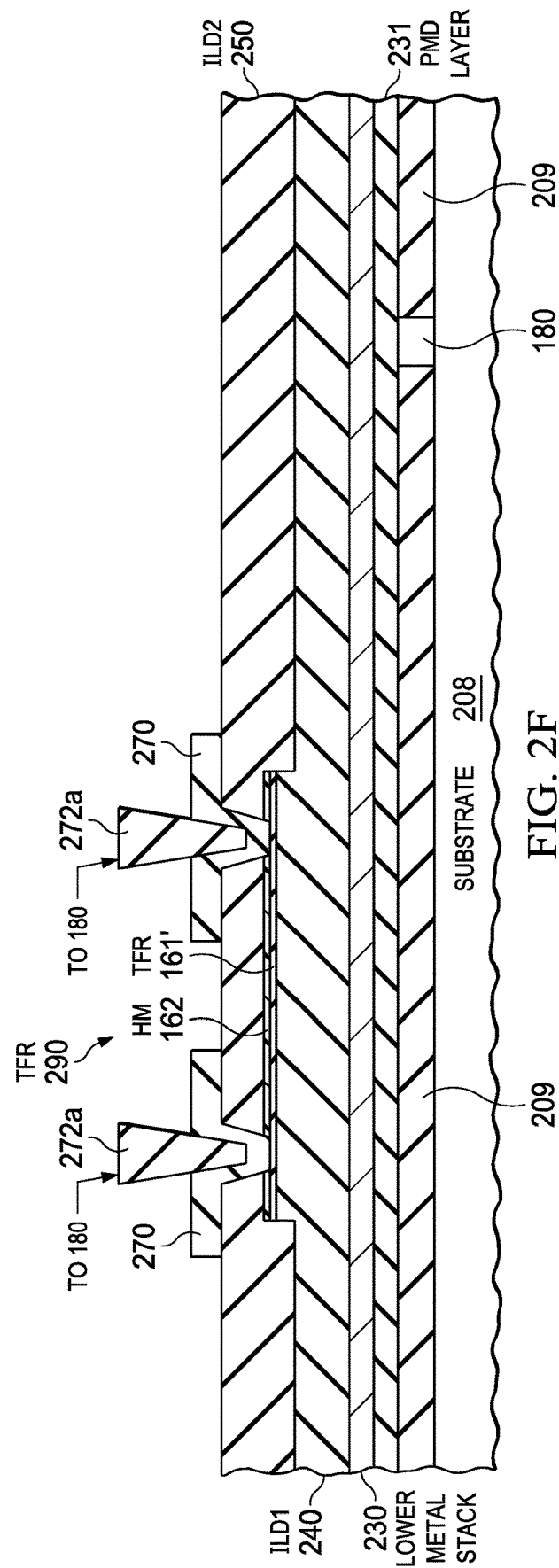

FIG. 2F shows the in-process IC after forming vias through the ILD2 layer 250 and the HM layer 162 to expose contacts on the TFR portion 161', and then depositing and patterning another electrically conductive layer shown by example as a thick SiCr layer 270 that is thick as compared to TFR portion 161', such as at least 10 times thicker. The thick SiCr layer 270 can be called a TFR head which is shown on top of the ILD2 layer 250. A plasma etch or a wet etch can be used to form the vias in the ILD2 layer 250 for the TFR heads.

After depositing the thick SiCr layer 270 another HM layer (not shown) may then be deposited which is then patterned, and then this HM layer and the thick SiCr layer 270 are etched. Another ILD oxide is then deposited (not shown), patterned, and is then etched to form vias which are then filled with an electrically conductive material to form the vias lands 272a shown in FIG. 2F. The via lands 272a provide contacts for contacting the thick SiCr layer 270 over the TFR portion 161' to form the TFR 290. The IC can then be completed by conventional back end of the line (BEOL) processing comprising forming one or more additional metal levels thereon including a top metal level. The top metal layer can comprise aluminum (or an aluminum alloy) or copper. Passivation overcoat (PO) may then follow, followed by patterning the PO. The PO layer comprises at least one dielectric layer such as silicon oxide, silicon nitride, or SiON. In the final IC, the TFRs having TFR portions 161', such as including a Cr compound layer (such as the TFR 290 shown in FIG. 2F) are connected within the circuitry 180.

Figure 3A:
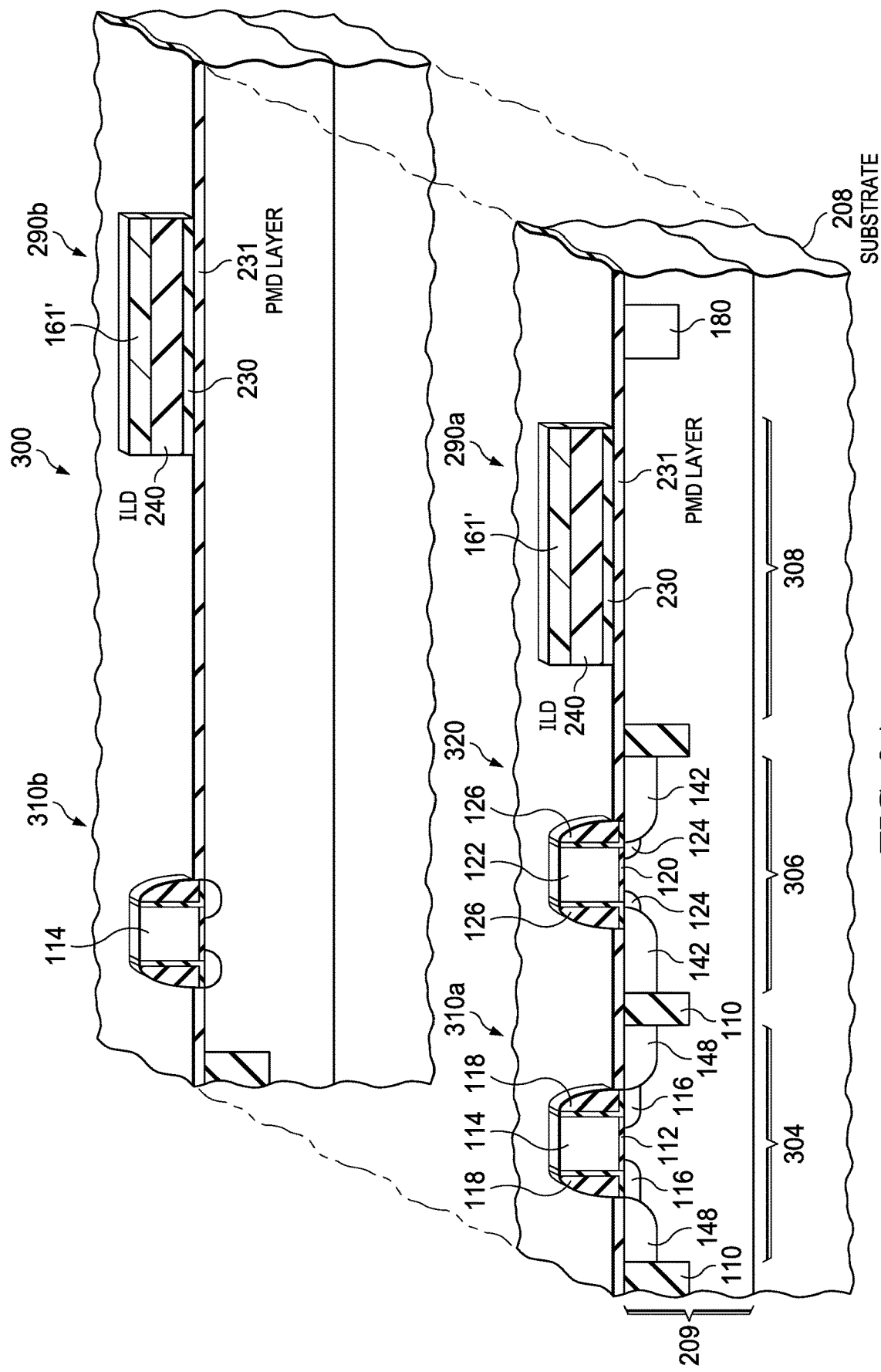
FIG. 3A is a cross sectional view of an example IC having a matching circuit including matched TFRs.

FIG. 3A is a cross sectional view of an example IC 300 having matched TFRs 290a, 290b and also optionally matched NMOS transistors 310a, 310b. The IC 300 is shown formed on a substrate 208 having a semiconductor surface layer 209 with a PMD layer 231 thereon. The IC 300 includes an NMOS area 304 shown having NMOS transistors 310a, 310b, a PMOS area 306 for PMOS transistors shown including a PMOS transistor 320, and a TFR area 308 for TFRs shown as TFRs 290a and 290b. Field oxide 110 is shown, for example formed by a shallow trench isolation (STI) process, which can provide laterally electrical isolation on the IC 300. The field oxide can also be a local Oxidation of Silicon (LOCOS) oxide.

The NMOS transistors 310a, 310b include a gate dielectric layer 112, a polysilicon (typically n+ doped) gate 114 over the gate dielectric layer 112, and gate sidewall spacers 118. The PMOS transistor 320 includes a gate dielectric layer 120, a polysilicon (typically p+ doped) gate 122 over the gate dielectric layer 120, and gate sidewall spacers 126. There are n-lightly doped drain (NLDD) regions 116 and n+ source/drain (SD) regions 148 for the NMOS transistors 310a, 310b. The PMOS transistor 320 includes p+SD regions 142 and p-LDD (PLDD) regions 124.

Figure 3B:
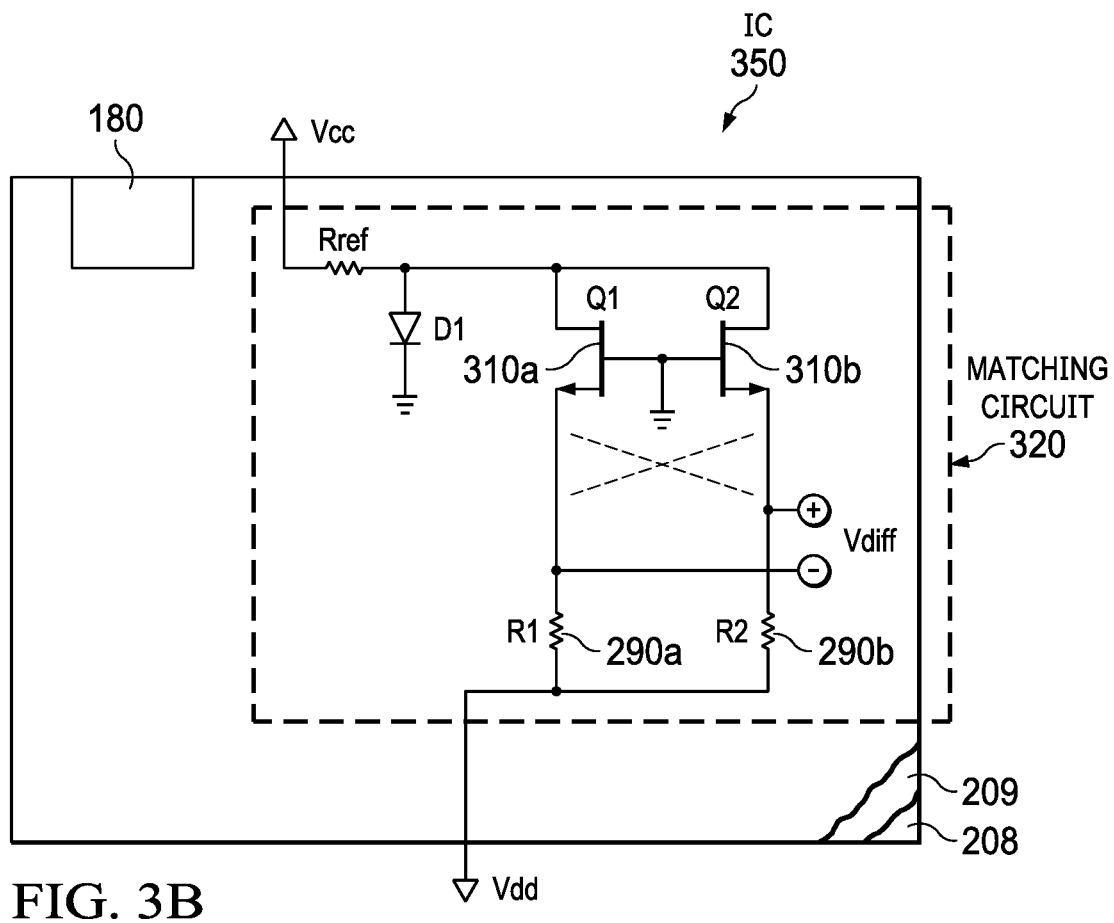
FIG. 3B is a depiction of an IC showing a portion including a matching circuit including matched TFRs and matched n-channel metal-oxide semiconductor (NMOS) transistors, according to an example aspect.

FIG. 3B is a depiction of a portion of an IC 350 including a matching circuit 320 including the TFRs 290a, 290b shown in FIG. 3A configured as matched TFRs, and also the NMOS transistors 310a and 310b shown in FIG. 3A configured as matched NMOS transistors 310a and 310b (as a differential pair). The IC 300 also includes circuitry shown as block 180 that coupled (not explicitly shown) to utilize the Vdiff signal generated by the matching circuit 320. During IC 350 operation, the NMOS transistors 310a and 310b are being compared by the matching circuit 320.

Rref and D1 set the voltage for the drains of NMOS transistors 310a and 310b. The gates of the NMOS transistors 310a and 310b are connected together and to a circuit ground. Currents are drawn from the sources of NMOS transistors 310a and 310b to the negative supply Vdd via matched TFRs 290a, 290b. The source voltages provide the Vdiff output which is a measure of their voltage difference.

In an ideal circuit, the TFRs 290a, 290b are perfectly matched so that the TFRs 290a, 290b have exactly the same resistance values. In that case the matching circuit 320 is perfectly symmetrical electrically so that Vdiff is 0 V. However, in practical implementations the NMOS transistors 310a and 310b are expected to be mismatched to some extent, as is the resistance of the TFRs 290a, 290b. Therefore, Vdiff is a measure of NMOS transistors 310a and 310b mismatch voltage at the current level which is set by TFRs 290a, 290b. Disclosed methods may reduce the mismatch in resistance of the TFRs 290a, 290b, thus improving the matching of the matching circuit 320 and accordingly improving the performance of the ICs having matched TFRs such as IC 350.

As described above disclosed methods provide the benefit of improved TFR Rs uniformity. Disclosed methods may also provide an IC die size reduction enabled by an eliminated or a reduced size TFR laser trim network size, trim fuse count, and/or digital interface. Reduced die size may result since other resistors in the signal path can be smaller due to better resistance matching. Disclosed processing also enables better internal and external resistor matching over wide frequency range, and allows for more predictable transconductance and/or gain of transistors and therefore better predictability of IC performance parameters such as bandwidth, slew rate, and filter corner frequencies.

Disclosed GCIB trimming is also expected to enable tighter absolute and matching TFRs. This may generally reduce (or eliminate) the amount of laser or electrical trimming (typically using one time programming (OTP) to control switches to select TFR links), thus lowering the test and silicon cost. This enables further reduction in the on-chip circuits or metal masks that are used to configure an IC in a family of ICs. Wafer probe for ICs with matched TFRs time may also realize a test time reduction due to less or no TFR laser trimming needed.

Examples

Disclosed aspects are further illustrated by the following specific Examples, which should not be construed as limiting the scope or content of this Disclosure in any way.

The TFR layers tested comprised SiCr that was on a dielectric layer across a 300 mm silicon wafer. The GCIB conditions used were described above relative to step 104 of method 100. The TFR layer was about 35 nm thick. As shown in Table 1 below, disclosed ion beam milling from GCIB processing (shown as 'Post") was found to provide about an 80% reduction in the a of the Rs of an unpatterned SiCr TFR layer as compared to the as-deposited TFR layer (shown as "Pre"). The average Rs of the unpatterned SiCr layer increased after ion beam milling by about 5%, which is attributed to some thickness reduction throughout. NU shown below refers to the Rs Non-Uniformity which may be determined, e.g., by the relation $NU=6\sigma/R_{s,avg}$.

TABLE 1

|  | Avg. Rs (ohm-cm) | Std. Dev (1σ) | % Rs NU (6σ) |
|---|---|---|---|
| Pre | 100 | 1.40 | 8.4 |
| Post | 105 | 0.25 | 1.4 |

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
    providing a substrate comprising a plurality of instances of the IC at an intermediate stage of fabrication with a dielectric layer over a metal layer above the substrate;
    forming an unpatterned resistive layer over the dielectric layer;
    obtaining measurements of a measured characteristic of the unpatterned resistive layer at each of a plurality of locations over the substrate;
    modifying the unpatterned resistive layer in response to the measurements such that the measured characteristic is more uniform across the substrate after the modifying; and
    defining a resistor on each of one or more instances of the IC from the unpatterned resistive layer after the modifying, wherein the resistor is electrically connected to a corresponding circuit component on each of the one or more instances.

2. The method of claim 1, wherein the modifying is performed by ion milling.

3. The method of claim 1, wherein the modifying is performed by Gas Cluster Ion Beam (GCIB) processing.

4. The method of claim 3, wherein the GCIB processing includes directing an argon ion beam towards the unpatterned resistive layer.

5. The method of claim 1, wherein the characteristic is a thickness of the unpatterned resistive layer.

6. The method of claim 1, wherein the characteristic is a sheet resistance (Rs) of the unpatterned resistive layer.

7. The method of claim 1, wherein the substrate is a member of a lot comprising a plurality of substrates, and wherein the modifying further comprising modifying the unpatterned resistive layer on each remaining member of the lot based on a difference between an average characteristic value for that member and an average characteristic value for the substrate.

8. The method of claim 3, wherein the modifying comprises scanning with a single pass having overlapping adjacent scans when performing the GCIB processing.

9. The method of claim 1, wherein the modifying includes modulating a scan speed of an ion beam across the substrate in response to the measured characteristic.

10. The method of claim 1, wherein the resistor comprises is one of a first thin film resistor (TFR) and a second TFR on the IC, and wherein the circuit component is a part of matching circuitry that includes the first TFR and the second TFR.

11. The method of claim 1, wherein the resistive layer comprises chromium.

12. The method of claim 1, wherein the resistive layer comprises doped polysilicon.

13. The method of claim 1, wherein a nonuniformity, equal to six times a standard deviation ($\sigma$) of the measured characteristic divided by an average value of the measured characteristic, excluding an edge exclusion region, is less than about 3% after the modifying.

14. The method of claim 1, wherein a surface of the unpatterned resistive layer after the modifying has an average surface roughness of less than about 3 nm.

15. A method of fabricating an integrated circuit (IC), comprising:
    forming an unpatterned resistive layer over a substrate;
    obtaining measurements of a characteristic of the unpatterned resistive layer at each of a plurality of locations over the substrate;
    modifying the unpatterned resistive layer in response to the measurements such that the characteristic is more uniform across the substrate after the modifying, and
    defining a resistor over the substrate from the unpatterned resistive layer after the modifying.

16. The method of claim 15, wherein the modifying is performed by ion milling.

17. The method of claim 15, wherein the modifying includes material removal by Gas Cluster Ion Beam (GCIB) processing.

18. The method of claim 15, wherein the modifying includes material removal by rastering a targeted beam across a surface of the unpatterned resistive layer.

19. The method of claim 15, wherein the resistive layer comprises silicon chromium (SiCr).

20. The method of claim 15, wherein the resistive layer comprises polysilicon.

* * * * *